((12)) United States Patent
Rosenbauer

(10) Patent No.: US 10,834,809 B2
(45) Date of Patent: Nov. 10, 2020

(54) OPTOELECTRONIC ASSEMBLY, AND METHOD FOR PRODUCING AN OPTOELECTRONIC ASSEMBLY

(71) Applicant: LEDVANCE GmbH, Garching (DE)

(72) Inventor: Georg Rosenbauer, Wassertrudingen (DE)

(73) Assignee: LEDVANCE GMBH, Garching (DE)

( * ) Notice: Subject to any disclaimer, the term of this patent is extended or adjusted under 35 U.S.C. 154(b) by 0 days.

(21) Appl. No.: 15/560,792

(22) PCT Filed: Mar. 21, 2016

(86) PCT No.: PCT/EP2016/056147
§ 371 (c)(1),
(2) Date: Sep. 22, 2017

(87) PCT Pub. No.: WO2016/150913
PCT Pub. Date: Sep. 29, 2016

(65) Prior Publication Data
US 2018/0084633 A1 Mar. 22, 2018

(30) Foreign Application Priority Data

Mar. 24, 2015 (DE) .......................... 10 2015 205 354

(51) Int. Cl.
*H05K 7/20* (2006.01)
*H05K 1/02* (2006.01)
(Continued)

(52) U.S. Cl.
CPC ........... *H05K 1/0203* (2013.01); *B23K 26/14* (2013.01); *B23K 26/16* (2013.01); *B23K 26/21* (2015.10);
(Continued)

(58) Field of Classification Search
None
See application file for complete search history.

(56) References Cited

U.S. PATENT DOCUMENTS 7,285,802 B2 * 10/2007 Ouderkirk ............. H01L 33/642
257/98
7,528,421 B2 * 5/2009 Mazzochette ....... H01L 25/0753
257/100
(Continued)

FOREIGN PATENT DOCUMENTS

DE 102012219879 A1 4/2014
DE 102013211977 B3 10/2014
(Continued)

*Primary Examiner* — Courtney L Smith
(74) *Attorney, Agent, or Firm* — Hayes Soloway PC

(57) ABSTRACT

An optoelectronic assembly is provided in different embodiments. The optoelectronic assembly has the following; a printed circuit board; at least one optoelectronic first component which is arranged on a first face of the printed circuit board; a heat sink which has a first surface that is arranged on a second printed circuit board face facing away from the first component, wherein a boundary surface extends between the second face and the first surface; and at least one first welding connection, by means of which the heat sink is directly connected to the printed circuit board in a bonded manner and which together with the boundary surface forms a first cut surface, the first component at least partly overlapping the cut surface.

20 Claims, 11 Drawing Sheets

Figure 1:
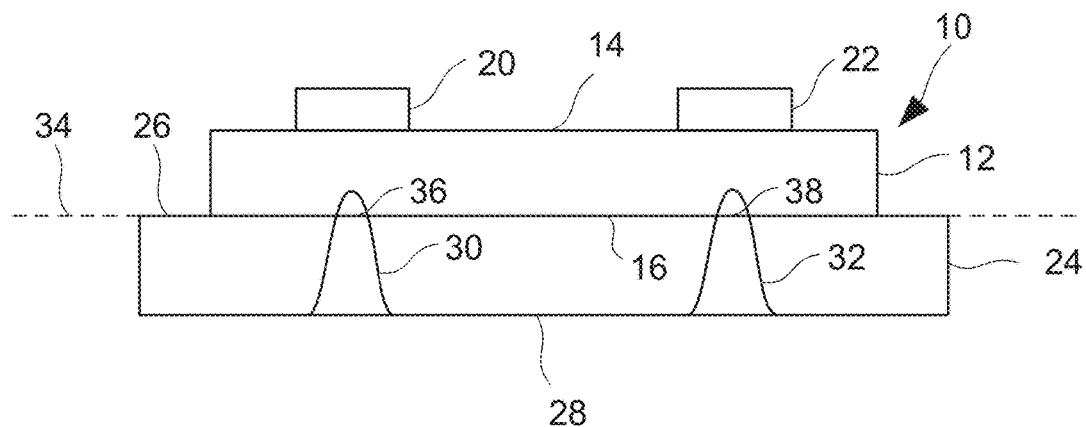

(51) Int. Cl.
    *B23K 26/21*     (2014.01)
    *H05K 3/00*     (2006.01)
    *H01L 33/64*     (2010.01)
    *B23K 26/14*     (2014.01)
    *B23K 26/16*     (2006.01)
    *B23K 26/70*     (2014.01)
    *H05K 1/18*     (2006.01)
    *H05K 3/22*     (2006.01)
    *H05K 3/30*     (2006.01)
    *H05K 1/05*     (2006.01)
    *B23K 101/42*     (2006.01)

(52) U.S. Cl.
    CPC ............ *B23K 26/703* (2015.10); *H01L 33/64* (2013.01); *H05K 1/181* (2013.01); *H05K 3/0061* (2013.01); *H05K 3/22* (2013.01); *H05K 3/303* (2013.01); *B23K 2101/42* (2018.08); *H01L 2933/0075* (2013.01); *H05K 1/028* (2013.01); *H05K 1/05* (2013.01); *H05K 2201/046* (2013.01); *H05K 2201/066* (2013.01); *H05K 2201/10106* (2013.01); *H05K 2201/10121* (2013.01); *H05K 2201/10522* (2013.01); *H05K 2203/082* (2013.01); *H05K 2203/107* (2013.01); *H05K 2203/1581* (2013.01)

(56) References Cited

U.S. PATENT DOCUMENTS

| | | | | |
|---|---|---|---|---|
| 7,679,918 | B2* | 3/2010 | Kim | H05K 1/021 165/104.33 |
| 8,253,026 | B2* | 8/2012 | Strauss | H05K 1/0207 174/252 |
| 8,368,206 | B2* | 2/2013 | Shiraishi | H01L 23/49861 257/713 |
| 8,408,749 | B2* | 4/2013 | Villard | F21K 9/00 362/294 |
| 9,209,106 | B2* | 12/2015 | Shi | H01L 23/3677 |
| 2001/0030866 | A1* | 10/2001 | Hochstein | F21V 29/004 362/294 |
| 2003/0116547 | A1 | 6/2003 | Choi et al. | |
| 2004/0095782 | A1* | 5/2004 | Isoda | H01L 33/642 362/555 |
| 2004/0201025 | A1* | 10/2004 | Barnett | F21V 3/04 257/79 |
| 2007/0147009 | A1* | 6/2007 | Morelle | H01L 23/36 361/720 |
| 2011/0205702 | A1* | 8/2011 | Grajcar | H05K 1/0204 361/692 |

FOREIGN PATENT DOCUMENTS

| | | |
|---|---|---|
| EP | 2365539 A1 | 9/2011 |
| FR | 2862424 A1 | 5/2005 |

\* cited by examiner

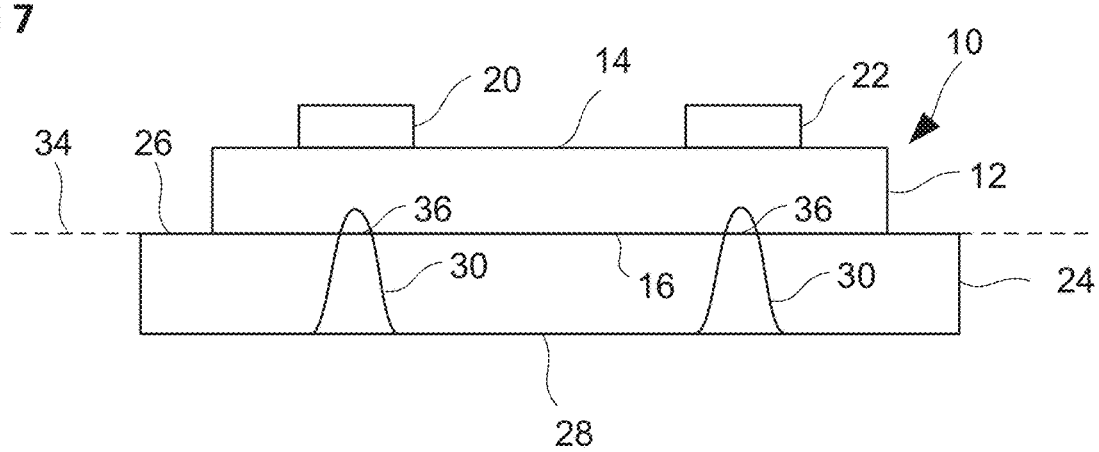
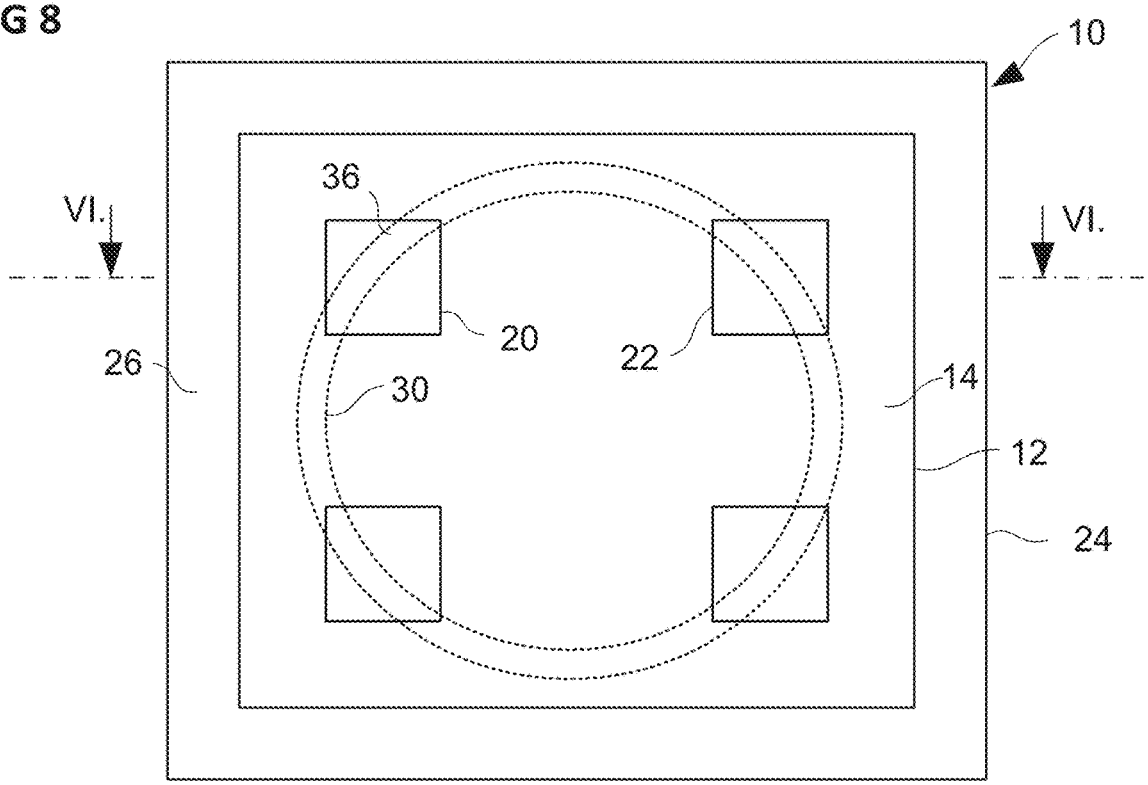

OPTOELECTRONIC ASSEMBLY, AND
METHOD FOR PRODUCING AN
OPTOELECTRONIC ASSEMBLY

CROSS-REFERENCE TO RELATED
APPLICATION AND PRIORITY

This patent application is a U.S. National Stage of International Patent Application No. PCT/EP2016/056147 filed on Mar. 21, 2016, which claims priority from German Patent Application No. 102015205354.7 filed on Mar. 24, 2015. Each of these patent applications is herein incorporated by reference in its entirety.

The invention concerns an optoelectronic assembly and a method for producing an optoelectronic assembly.

A conventional optoelectronic assembly comprises at least one optoelectronic component which is arranged on a printed circuit board. The optoelectronic component may for example be a light-emitting diode (LED), an organic light-emitting diode (OLED) or a solar cell. The printed circuit board is arranged on a heat sink on a side of the circuit board facing away from the optoelectronic component. The circuit board is attached to the heat sink by means of a connecting element, for example by means of a screw and/or an adhesive, for example a heat-conductive adhesive.

The material costs for the adhesive and the process costs for the adhesive and its use are relatively high. In particular, the application and metering of the adhesive are complex and the machines required for this are costly. Substances in the adhesive can decompose over time, so that the adhesive must be mixed or refreshed before application. Nozzles for applying and/or metering the adhesive may clog over time and must then be exchanged or cleaned. To cure the adhesive following its application, regularly temperatures above 100° C. are required which must be maintained for one hour. This entails high energy costs and a lot of space is required for the necessary ovens. Furthermore, it must be ensured that the adhesive is chemically compatible with adjacent polymers, for example with the lens or the housing of the optoelectronic component. Also, even a relatively good heat-conductive adhesive often has a poor thermal conductivity compared with a metal core printed circuit board or a heat sink. For example, the thermal conductivity of a good heat-conductive adhesive may be less than 10 W/mK, for example 2 W/mK, whereas an aluminium alloy, for example a heat sink or circuit board, has a thermal conductivity of more than 150 W/mK. The heat-conductive adhesive is, visually speaking, normally a thermal needle eye. Not least, when adhesive is used for connecting the circuit board to the heat sink, relatively high logistics costs are incurred since suitable adhesive must be transported and often cooled.

Also, high process costs are incurred when fixing by means of screws, since holes must be drilled and threads cut, for example in the circuit board and/or the heat sink, wherein the holes and/or threads take up a certain space on the circuit board in addition to the optoelectronic components, so a relatively large circuit board and/or heat sink is required. Furthermore, screw connections are very sensitive to increased surface roughness of the circuit board and/or heat sink, since then only localised contact faces are created in the contact region between the circuit board and the heat sink which allow a relatively small heat transmission.

DE 10 2012 219 879 A1 discloses an optoelectronic assembly in which a cooling body metal is connected to a MCPCB by means of laser transmission welding. By means of the laser, the cooling body metal is irradiated from below, i.e. from the side of the cooling body metal facing away from the optoelectronic component, and the complete heat sink is through-welded and also part of the MCPCB is locally melted. During laser welding, a so-called keyhole is produced which leads to a very narrow but deep weld seam. In laser welding, the two fusible materials of the heat sink and the circuit board join in the weld seam, allowing a good heat transmission.

It is an object of the invention to provide an optoelectronic assembly in which the heat transmission is further improved in a simple and/or effective manner, in particular without using an adhesion-promoting agent, in particular a solder or adhesive, in particular a heat-conductive adhesive.

It is an object of the invention to provide a method for producing an optoelectronic assembly which can be carried out easily and/or economically, and/or which contributes, in the optoelectronic assembly, to further improving the heat dissipation away from the optoelectronic component of the optoelectronic assembly in a simple and effective manner, in particular without using an adhesion-promoting agent, for example a solder and/or an adhesive, in particular a heat-conductive adhesive.

According to one aspect of the invention, this object is achieved by an optoelectronic assembly, with a printed circuit board, at least one first optoelectronic component which is arranged on a first side of the circuit board, a heat sink which comprises a first surface and is arranged with its first surface on a second side of the circuit board facing away from the first component, wherein a bounding surface extends between the second side and the first surface, and at least one first weld connection, by means of which the heat sink is connected directly by substance bonding to the circuit board and which forms a first intersecting surface with the bounding surface, wherein the first component at least partially overlaps the intersecting surface.

The first component at least partially overlapping the first intersecting surface means that when the optoelectronic assembly is arranged such that the circuit board and the heat sink extend in one horizontal plane, the first component is arranged at least partially above the first intersecting surface in a top view onto the optoelectronic assembly. Visually speaking, the first weld connection and in particular the first intersecting surface are arranged directly behind the first component.

Furthermore, the first intersecting surface and an active layer of the first component may overlap at least partially. An active layer of the first component may here be the region of the component in which electromagnetic radiation is generated by the recombination of charge carriers. For example, the active layer in a light-emitting diode may be part of an epitaxially applied layer sequence. The active layer may extend in a horizontal plane which is arranged substantially parallel to the circuit board.

The bounding surface is not a real surface but merely an imaginary surface which serves to define the first intersecting surface. The bounding surface may for example, before formation of the first weld connection, correspond to the second side of the circuit board or to the first surface of the heat sink, or at least run parallel thereto. On formation of the first weld connection however, the materials of the second side of the circuit board and the first surface of the heat sink melt, so that after formation of the first weld connection, these are no longer clearly defined in the region of the first weld connection; for this reason, after formation of the first weld connection, the bounding surface is a support construct to enable the position of the first intersecting surface to be defined precisely relative to the first component. If the second side of the circuit board and/or the first surface of the heat sink are formed flat, the first bounding surface lies in a plane and/or could be described as a bounding plane. If the second side of the circuit board and the first surface of the heat sink are formed curved, the bounding surface is curved correspondingly. If the second side of the circuit board and the first surface of the heat sink have a kink, the bounding surface has a corresponding kink.

The position of the direct substance-bonded first weld connection relative to the first component generating heat in operation, for example a LED or an OLED, ensures a particularly good heat dissipation from the first component via the circuit board to the heat sink. The particularly good heat dissipation is achieved by an increased contact pressure of the circuit board on the heat sink directly below the first component. In other words, a high contact force between the circuit board and the heat sink directly behind the first component causes a low thermal resistance at the transition from the circuit board to the heat sink in this region.

The increased contact pressure or increased contact force are achieved by shrinkage stresses which occur on production of the first weld seam. In particular, the fusible materials in the weld zone of the circuit board and the heat sink are drawn towards each other on cooling, which causes a very high surface pressure directly behind the first component and hence a low thermal resistance and good heat dissipation away from the first component. Furthermore, the high surface pressure causes a deformation of roughness peaks of the circuit board and/or heat sink, and hence a larger contact area between the circuit board and heat sink, whereby the thermal conductivity and heat dissipation are further improved, in particular directly behind or below the first component. Also, after welding, frequently accumulations of the welded materials may be found on the surface of the weld seam of the weld connecting point, which accumulations are formed during welding of fusible material and constitute a type of material loss in the interior of the weld seam; in addition to the pure material contraction of the weld materials, also high shrinkage stresses are hereby generated, whereby the contact pressure or contact force is particularly high. Furthermore, the larger the area melted because of the weld process, the greater the inherent stresses and/or surface pressures produced, and the better the heat transmission.

Thus production of the first weld seam is connected to the generation of shrinkage stresses which provoke an increased surface pressure in the contact region between the circuit board and the heat sink directly behind the first component, which in turn leads to a particularly good heat dissipation directly behind the first optoelectronic component. Thus the heat generated by the first optoelectronic component can be dissipated particularly well from the circuit board towards the heat sink. This means that the first component can be operated with particularly high power and/or for a particularly long time without damage.

If the first component is attached to the circuit board by means of a solder connection or a weld connection, a first weld connection, in particular the laser weld seam, directly behind the first component may also contribute to the solder or weld connection between the first component and circuit board being particularly stable with regard to mechanical strength and thermal shock stress. The cause of this is the repeated melting and cooling of the solder or weld connection at a predefined laser power and weld depth. Due to the rapid chilling in the laser process because of very high cooling rates for spot laser heating, a very fine-grained structure is produced in the solder or weld connection, which is particularly good for the mechanical strength and thermal shock stress in the thermal shock test.

Furthermore, no material costs are incurred for adhesive or screws, no curing is required, the process can be performed quickly and contactlessly and is automatable, the heat transmission is usually better than with adhesive and/or screwing, no space is required on the MCPCB for drilling holes for screws, and a high mechanical strength and high thermal shock resistance in relation to thermal shock stress are achieved. Screw connections cannot loosen, and no ageing effects can occur as with adhesive.

In a refinement, the first component completely overlaps the first intersecting surface. In other words, when the circuit board is oriented horizontally, the first intersecting surface in top view lies completely behind the first component. This can contribute to a particularly high thermal conductivity coefficient directly behind the first component and hence to a particularly good heat dissipation away from the first component.

In a refinement, the first weld connection extends through the entire thickness of the heat sink. This may contribute to the first weld connection being particularly simple to produce.

In a refinement, the first weld connection in the direction parallel to the bounding surface is formed linear, in particular rectilinear, polygonal, circular and/or as a meander. Tests with different geometries of the first weld connection have shown that, in addition to the substance-bonded weld connection directly behind the first component, the contact pressure or contact force between the circuit board and the heat sink can be produced in a targeted fashion by means of a suitable geometry of the first weld connection, in particular the corresponding laser weld seam. In particular, tests have shown that a weld seam which is linear in the lateral direction, surrounding a closed area, is polygonal, circular and/or formed as a meander, can generate particularly high shrinkage stresses and hence high contact pressures, which achieves a particularly high thermal conductivity coefficient and particularly good heat dissipation. Here, said geometries may also be combined, for example the first weld connection may be configured such that it runs linearly and as a meander, whereby a weld bead is produced. The weld bead can then be formed so that it surrounds a closed area, for example a polygonal or circular area, whereby the shrinkage stresses, contact pressure and contact force are further increased and the thermal conductivity further improved.

In a refinement, the first weld connection is formed circular and at least one second weld connection is formed, by means of which the heat sink is connected directly by substance bonding to the circuit board, and which is formed concentrically to the first weld connection. The second weld connection forms a second intersecting surface with the bounding surface. The second weld connection may also be formed circular. The second weld connection may be configured such that the first component at least partially overlaps the second intersecting surface. For example, the second weld connection may be configured such that the first component completely overlaps the second intersecting surface. Alternatively, the first and/or the second weld connection may be formed such that the first component and one, two or three further components at least partially overlap the first and/or the second intersecting surface. For example, the corresponding components may overlap individual segments of the weld connections. The concentric formation of the second weld connection relative to the first weld connection in particular causes high shrinkage stresses and contact pressures and hence a particularly good heat dissipation directly behind the component.

In a refinement, the first weld connection is formed rectilinear and at least one second weld connection is formed, by means of which the heat sink is connected directly by substance bonding to the circuit board, and which forms a second intersecting surface with the bounding surface and which is formed parallel to the first weld connection. The second weld connection may also be formed linear. The second weld connection may be formed such that the first component at least partially overlaps the second intersecting surface. For example, the first and/or the second weld connection may be formed such that the first component and one, two or three further components at least partially overlap portions of the first and/or the second intersecting surface. For example, the corresponding components may be arranged as a matrix in rows and columns, and the weld connections may be formed along the rows and/or columns. The parallel, columnar and/or row-like formation of the weld connections causes particularly high shrinkage stresses and contact pressures and hence a particularly good heat dissipation.

In a refinement, the optoelectronic assembly has at least one second optoelectronic component, for example the above-mentioned second component, which is arranged on the first side of the circuit board and which at least partially overlaps the first intersecting surface and/or the second intersecting surface. The arrangement of the second component such that it at least partially overlaps the first and/or the second intersecting surface causes the heat dissipation away from the second component to be particularly good.

In a refinement, the first weld connection and/or the second weld connection penetrates the circuit board to a depth which corresponds to 5% to 50% of the thickness of the circuit board. For example, the depth may correspond to 20% of the thickness of the circuit board. This may contribute to firstly the mechanical strength of the weld connection being particularly good, but nonetheless the component or components are not overheated on production of the weld connections.

An object is achieved according to one aspect by a method for producing an optoelectronic assembly, wherein a printed circuit board is provided, at least one first optoelectronic component is arranged on a first side of the circuit board, the first surface of the heat sink is arranged on the second side of the circuit board facing away from the first side, wherein a bounding surface extends between the second side and the first surface, and the circuit board is connected to the heat sink directly by substance bonding by means of at least one first weld connection, wherein the first weld connection is formed by means of a laser beam radiated from the outside onto a second surface of the heat sink facing away from the circuit board, such that the first weld connection forms the first intersecting surface with the bounding surface, and the first component at least partially overlaps the first intersecting surface.

The advantages described above in connection with the optoelectronic assembly may simply be transferred to the method for producing an electronic assembly. Also, production of the first weld seam by means of the laser beam is particularly quick, simple, precise and/or economic.

In a refinement, the heat sink and/or the circuit board are cooled during formation of the first weld connection. The cooling may for example take place by means of a cooling gas, in particular air cooling, for example by blowing onto the circuit board and/or the heat sink, and/or by means of bodily contact with a cooling element. Cooling may contribute to the first component and/or the circuit board not overheating and being damaged on production of the first weld connection. In this way, the laser process window in relation to welded area then lying under shrinkage stress may be significantly enlarged.

In a refinement, smoke which is produced on formation of the first weld connection is extracted during formation of the first weld connection. This may contribute to the optoelectronic assembly not being soiled on production of the first weld connection.

In a refinement, at least the second weld connection is formed, by means of which the circuit board on its second side is connected directly by substance bonding to the first surface of the heat sink, wherein the second weld connection is formed by means of a laser beam radiated from the outside onto the second surface of the heat sink. The laser beam may be the same or a different laser beam from the laser beam used to form the first weld connection.

In a refinement, the second weld connection is formed after a predefined time period after formation of the first weld connection. The setting of a time period may contribute to the first component and/or the circuit board not being overheated and damaged on production of the weld connections.

In a refinement, simultaneously with the formation of the first weld connection and by means of the same laser beam with which the first weld connection is formed, the first component is connected by substance bonding to the circuit board. The substance-bonded connection between the first component and the circuit board may for example be a solder connection or a weld connection. In other words, by means of the laser beam, the circuit board may be heated such that the substance-bonded connection is created to the first component. For example, solder may be arranged between the first component and the circuit board, and melts on production of the first weld connection, and on subsequent cooling connects the circuit board to the first component by substance bonding. This allows two working steps, in particular the connection of the first component to the circuit board and the connection of the circuit board to the heat sink, to be performed in one working step. This may contribute to the process time being particularly short and the process costs particularly low.

The object is achieved according to one aspect by a method for producing an optoelectronic assembly, wherein the printed circuit board is provided, the first optoelectronic component is arranged on the first side of the circuit board, and the first component is connected by substance bonding to the circuit board by means of a laser beam radiated from the outside onto the second side of the circuit board facing away from the first component. Thus the substance-bonded connection of the first component to the circuit board is achieved independently of the formation of the first weld connection. This may contribute to the first component being connected to the circuit board in a simple fashion, quickly, precisely and/or economically.

Exemplary embodiments of the invention are depicted in the figures and explained in more detail below.

Figure 2:
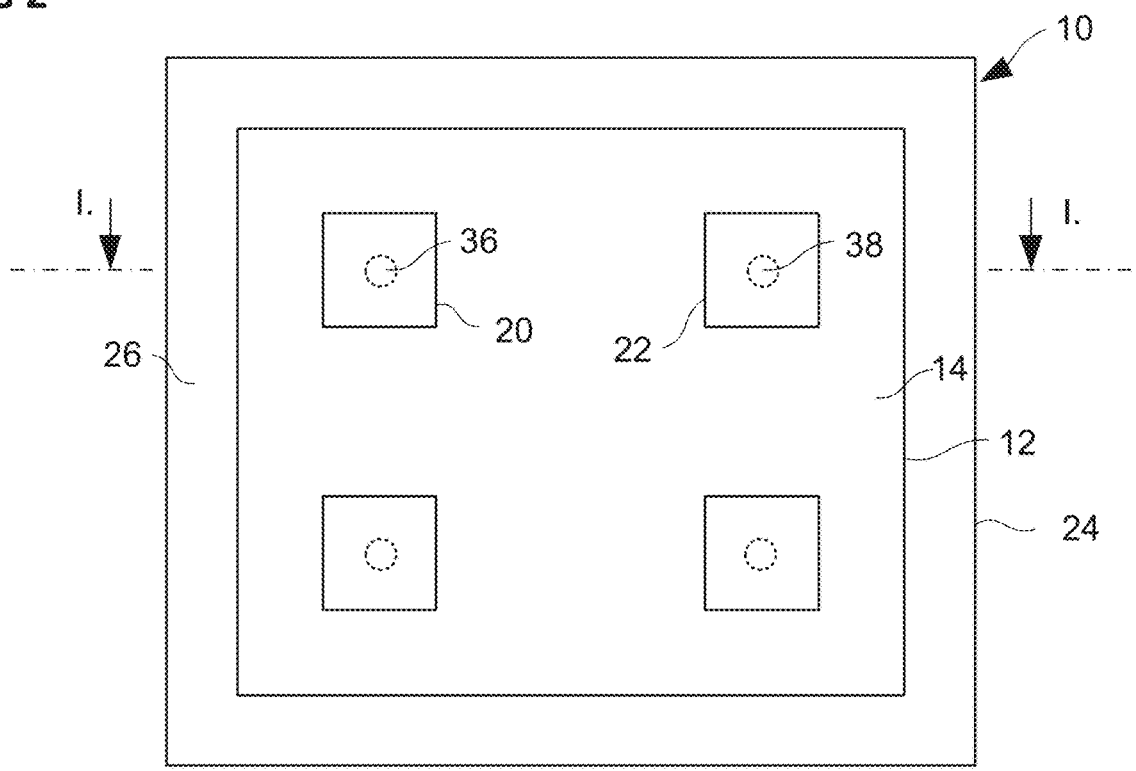
Figure 3:
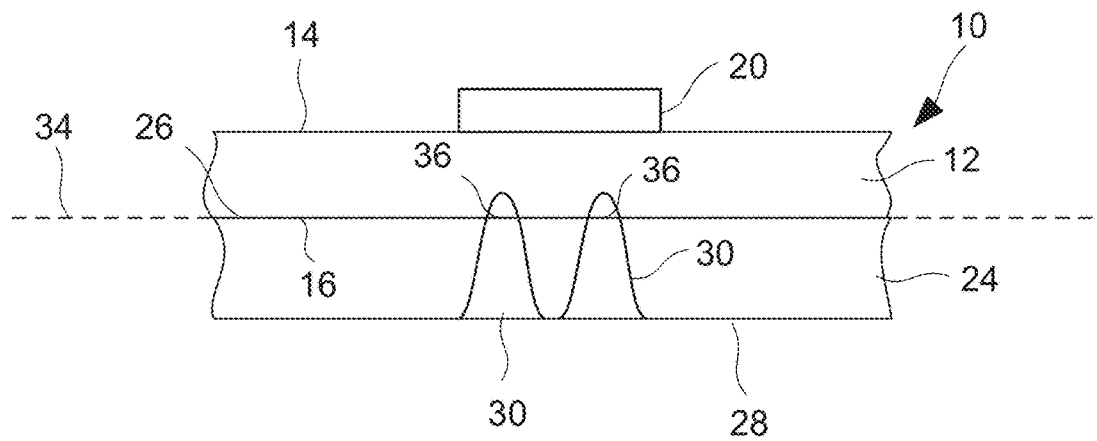
Figure 4:
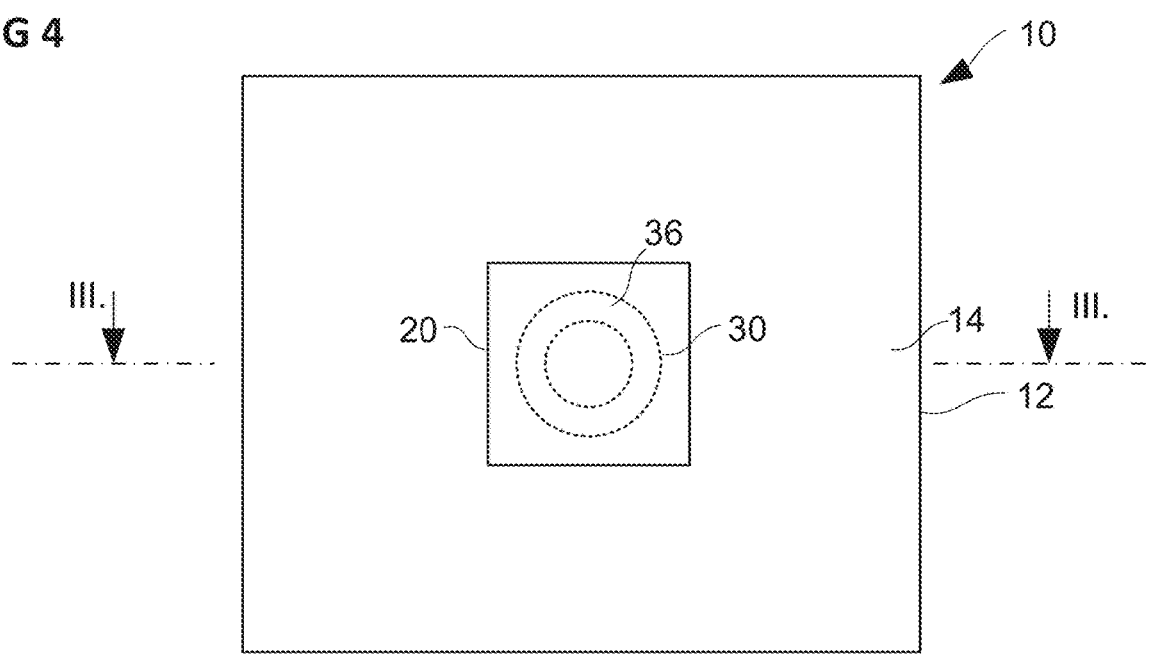
Figure 5:
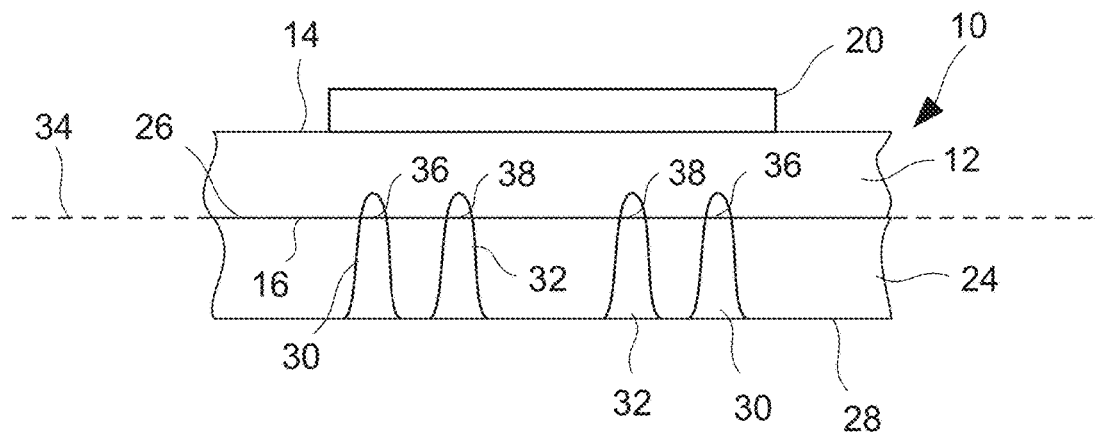
Figure 6:
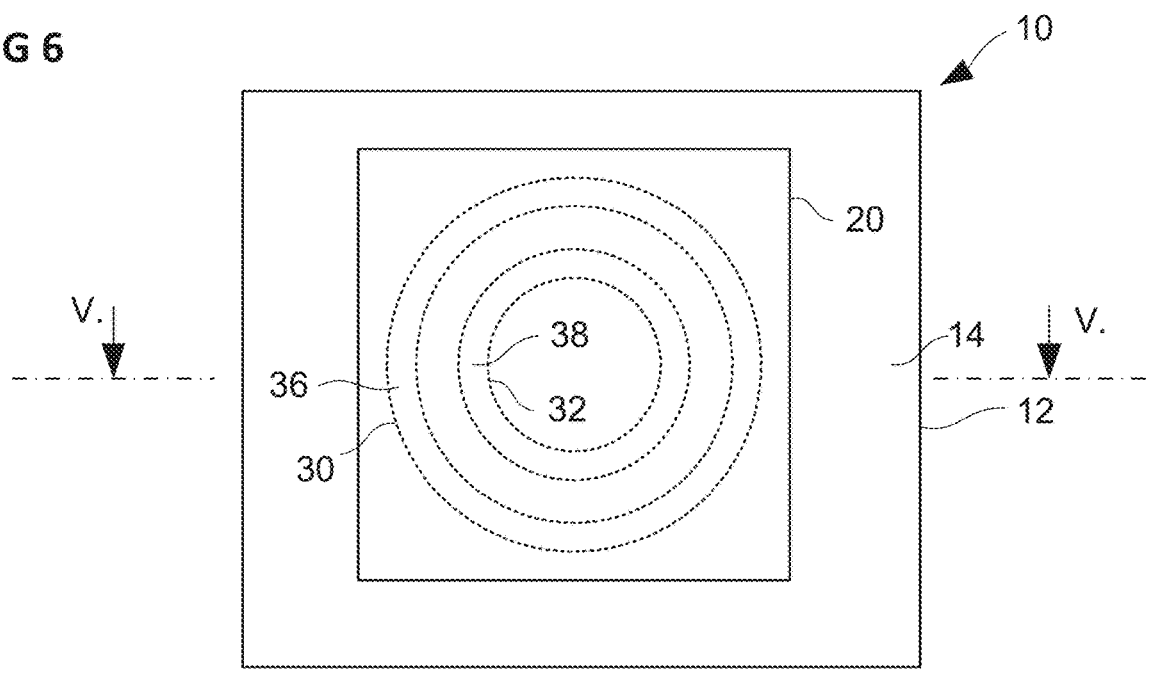
Figure 9:
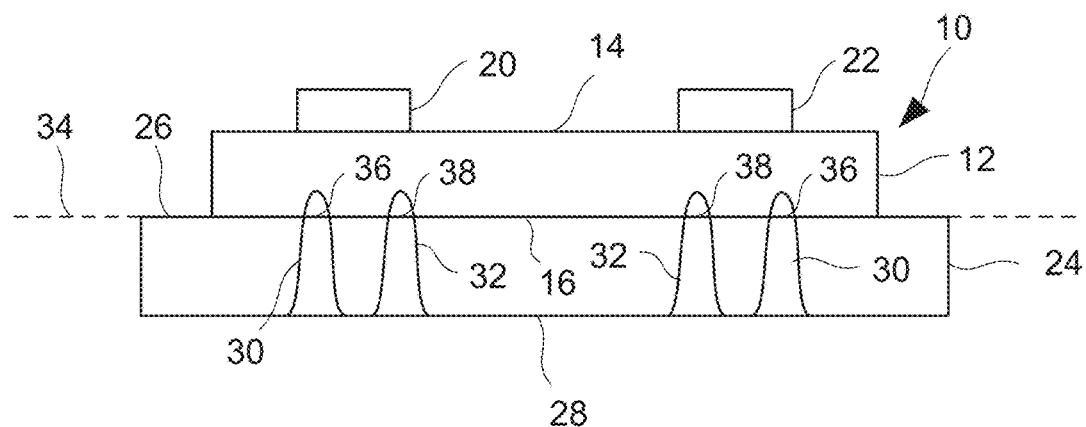
Figure 10:
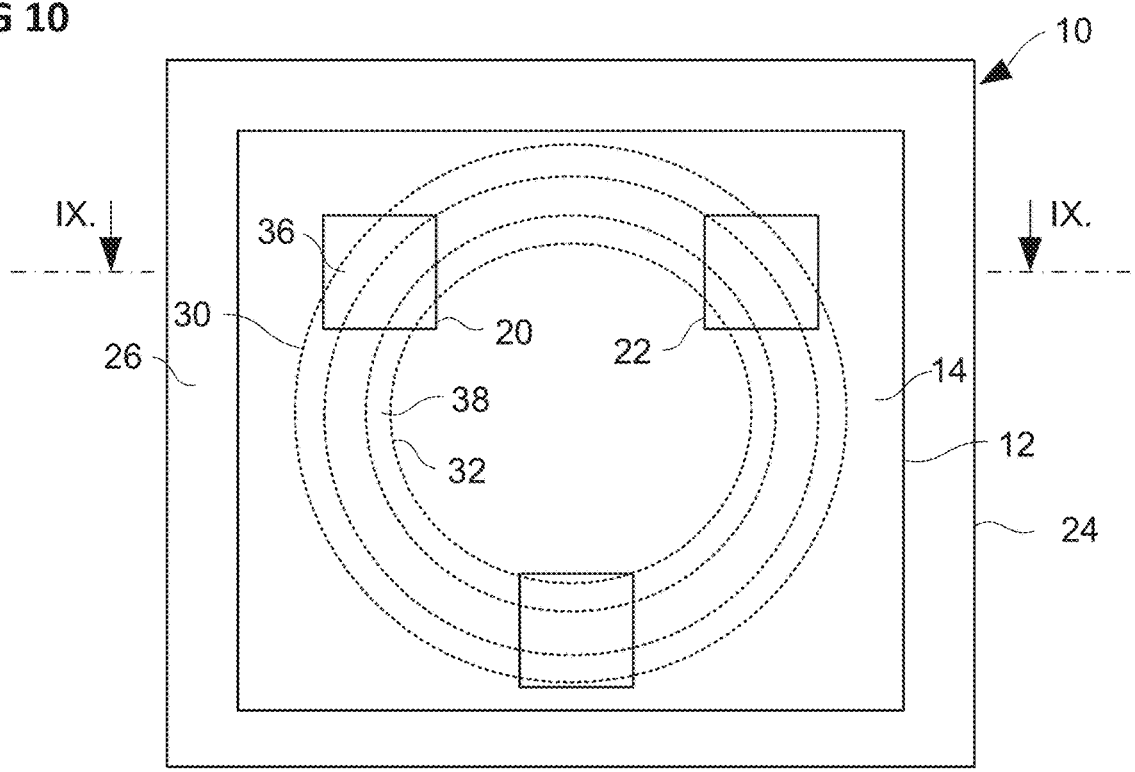
Figure 11:
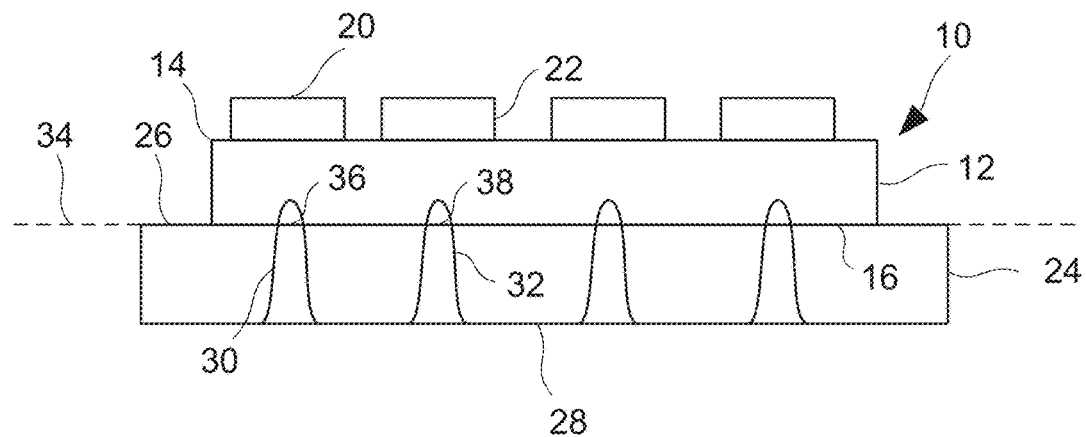
Figure 12:
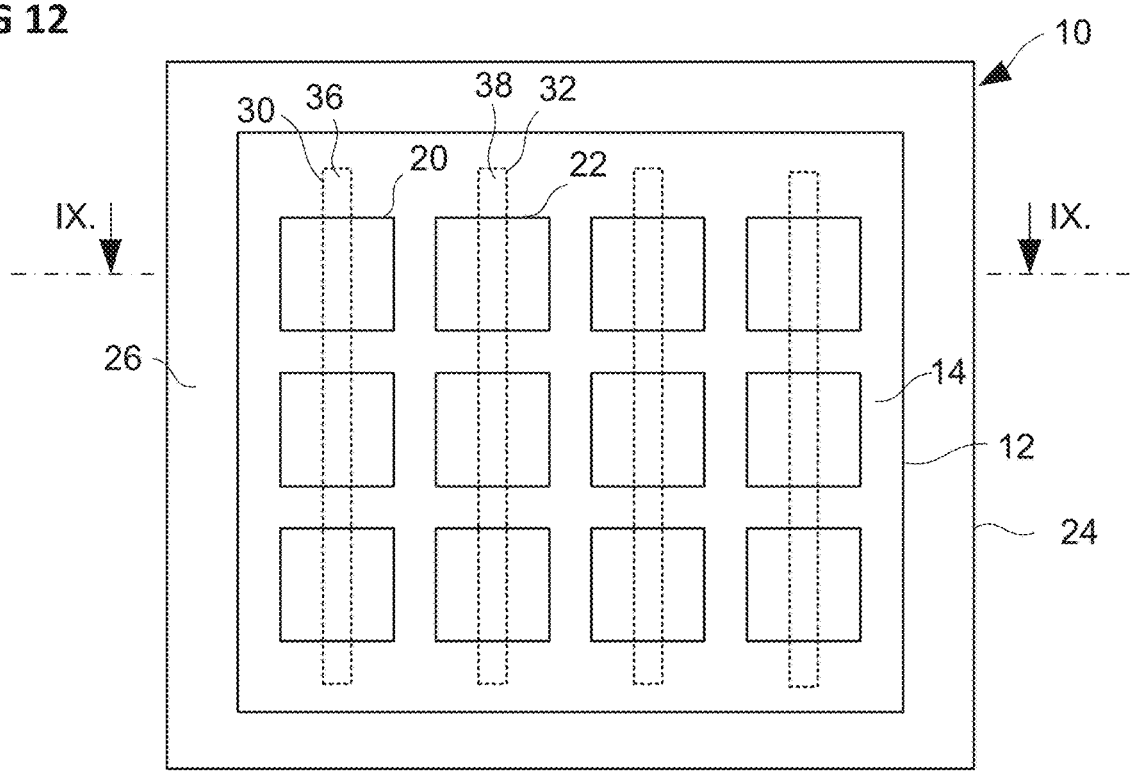
Figure 13:
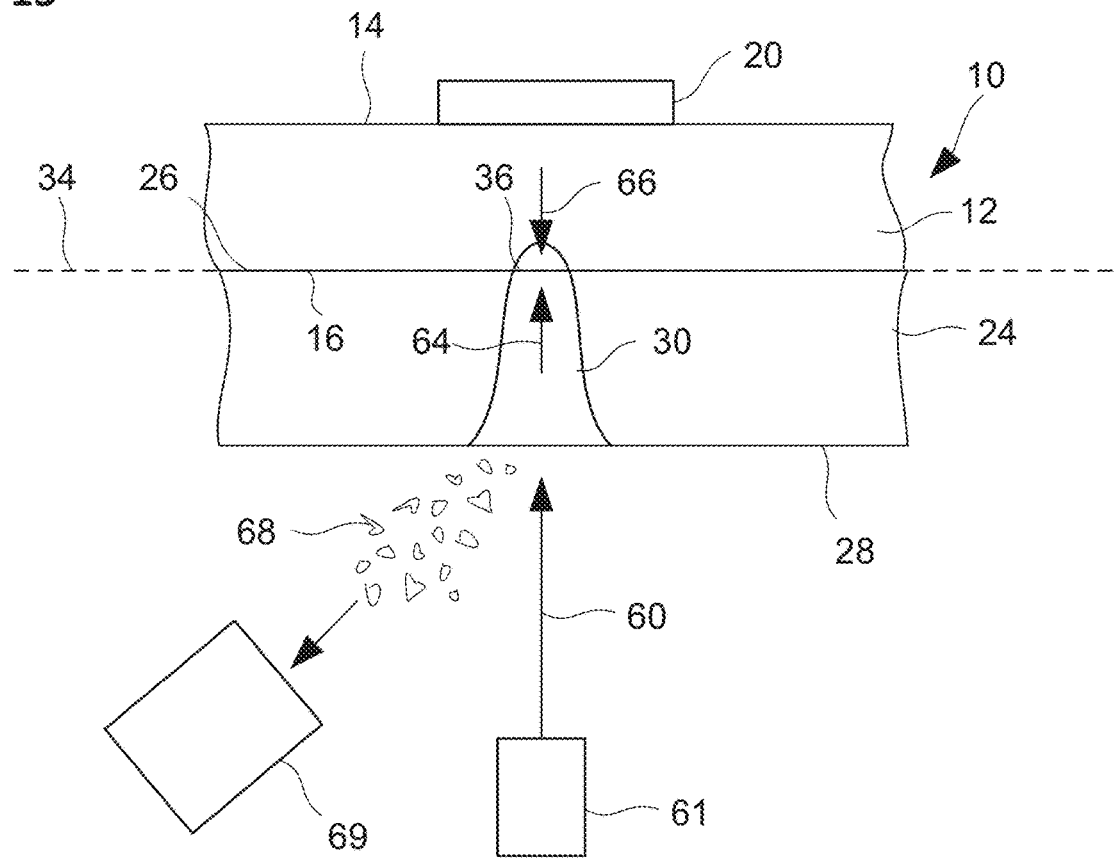
Figure 14:
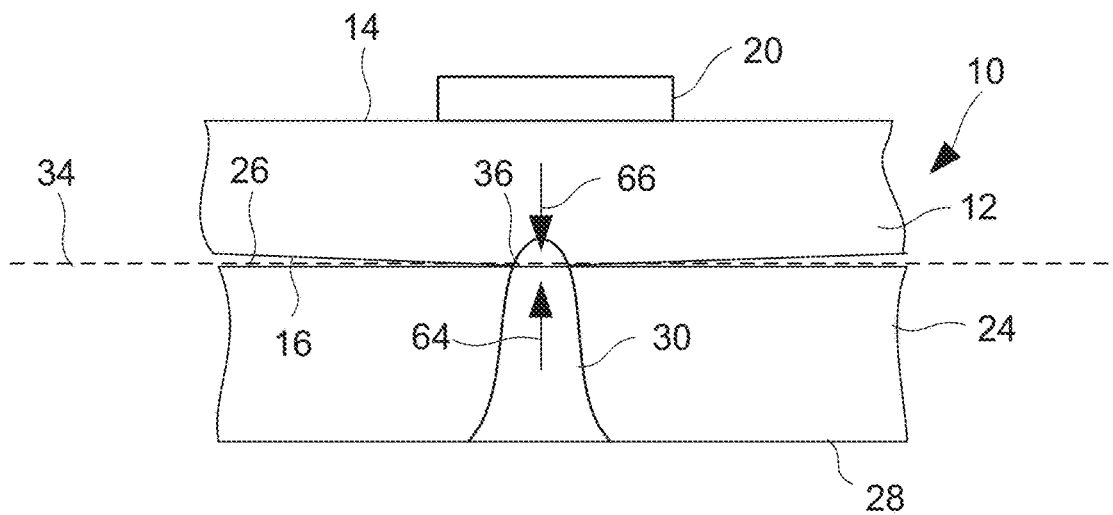
Figure 15:
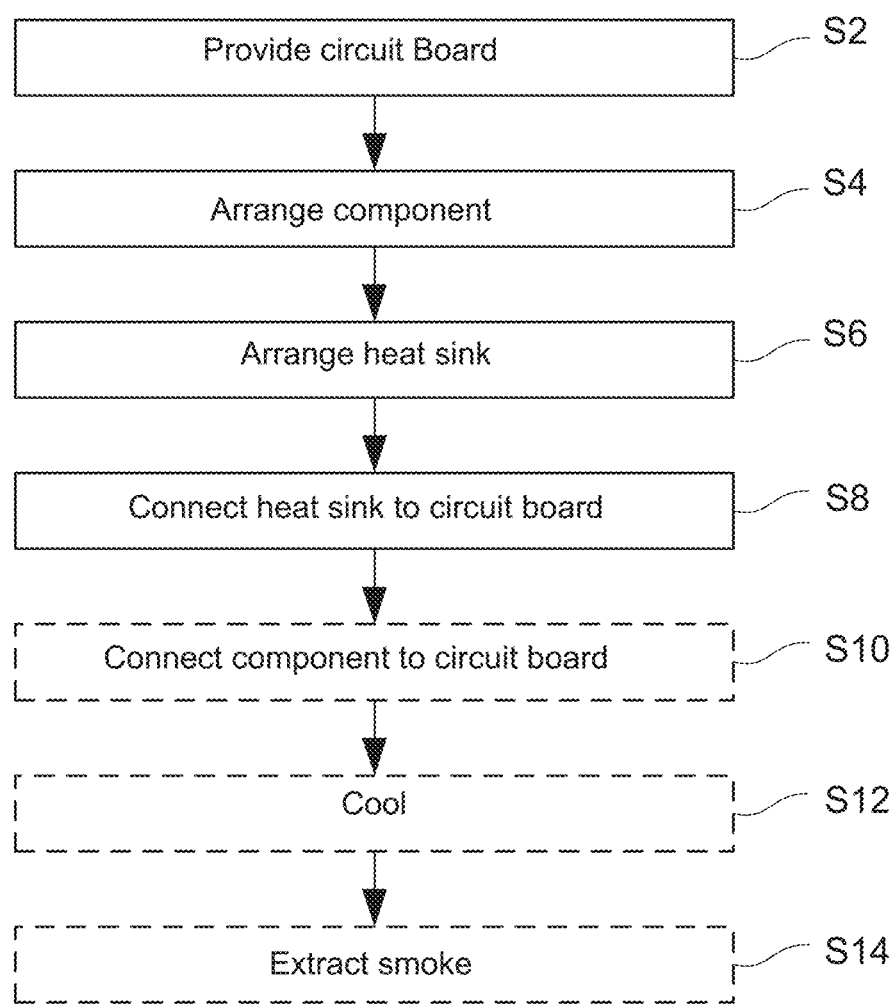
Figure 16:
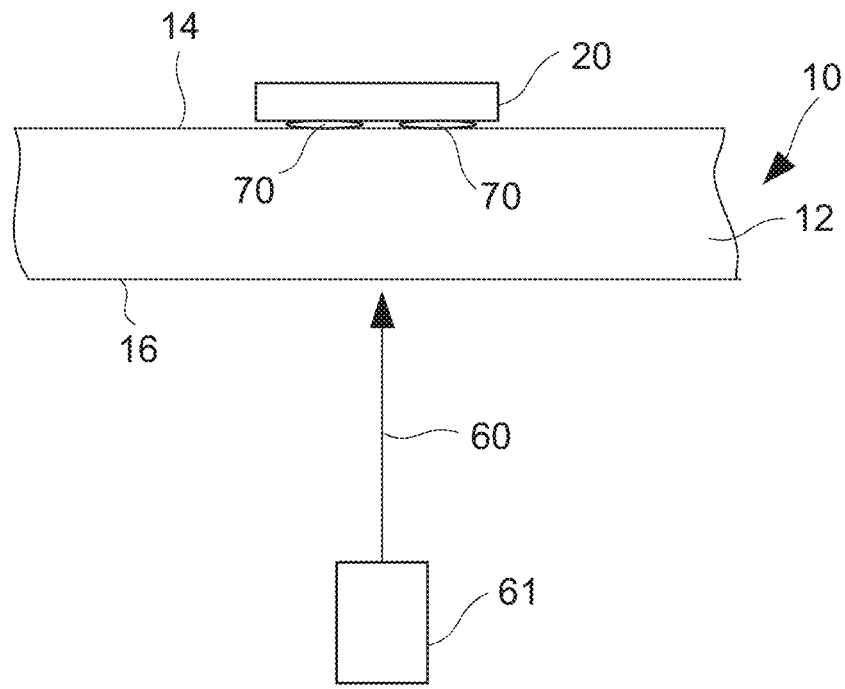
Figure 17:
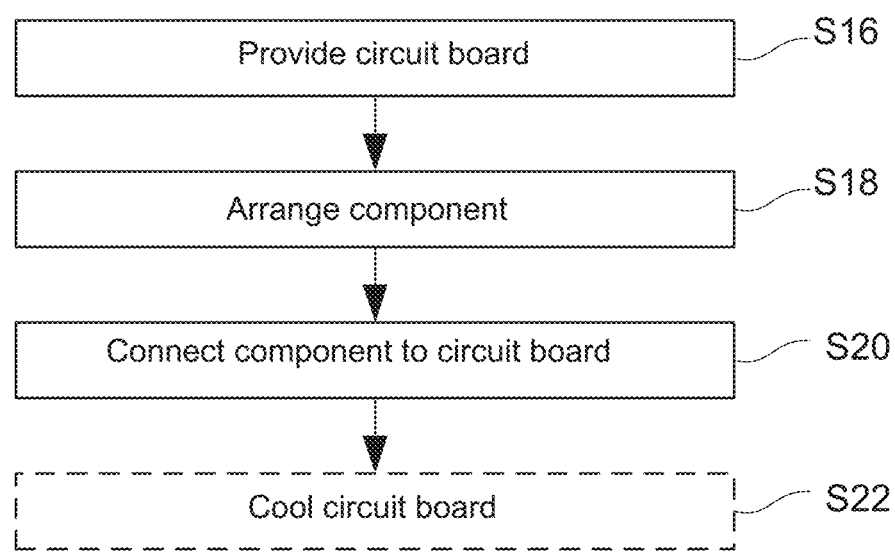
Figure 18:
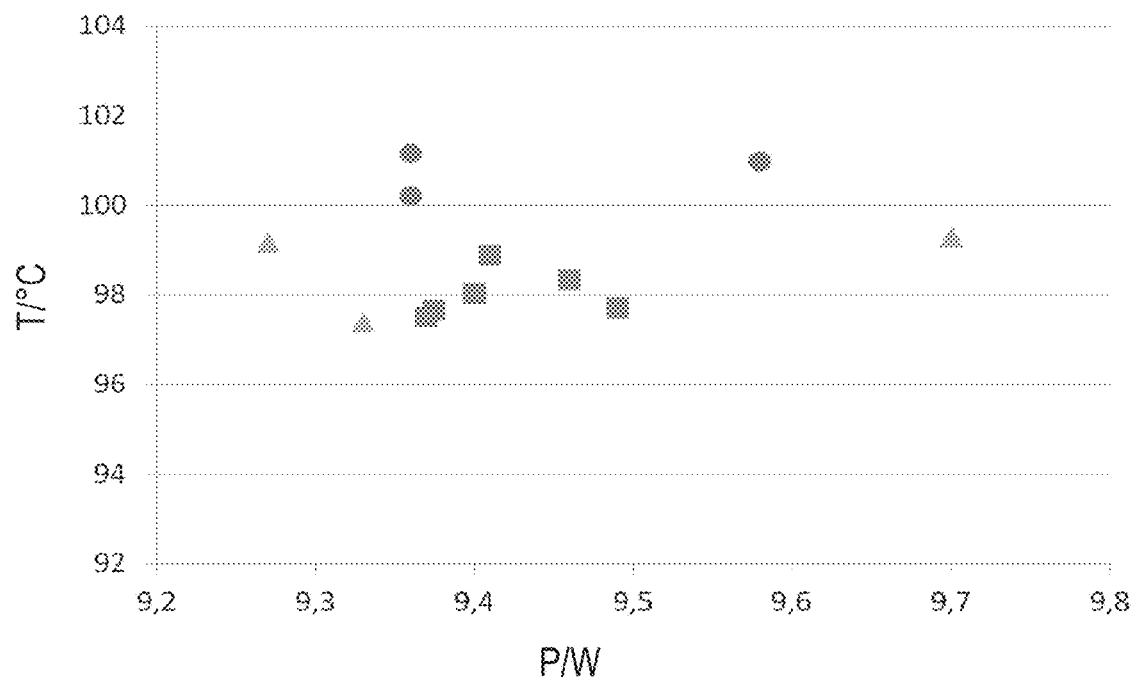
Figure 19:
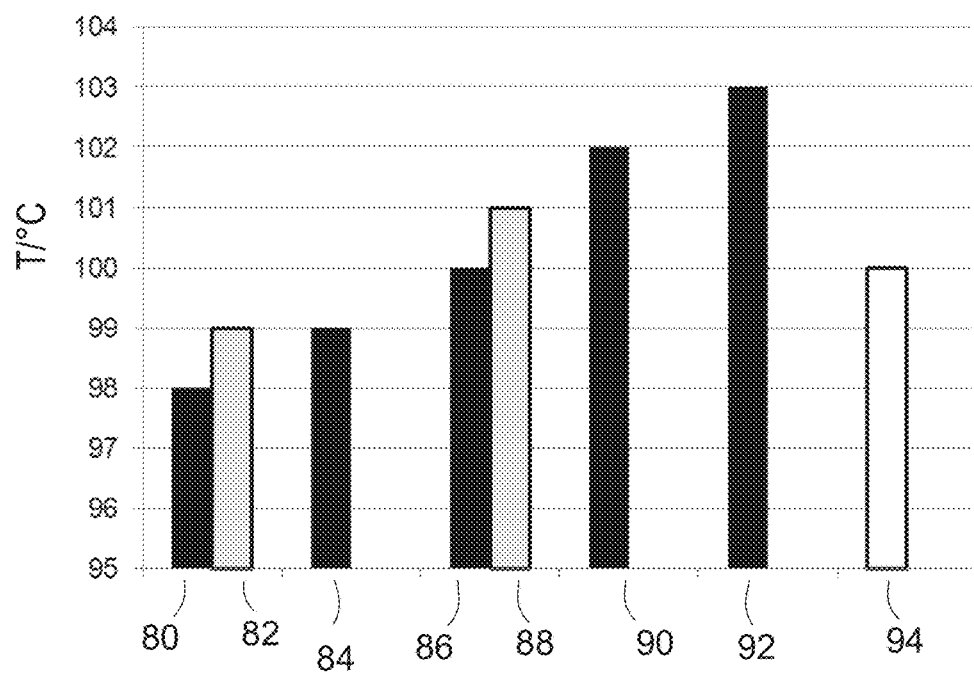
Figure 20:
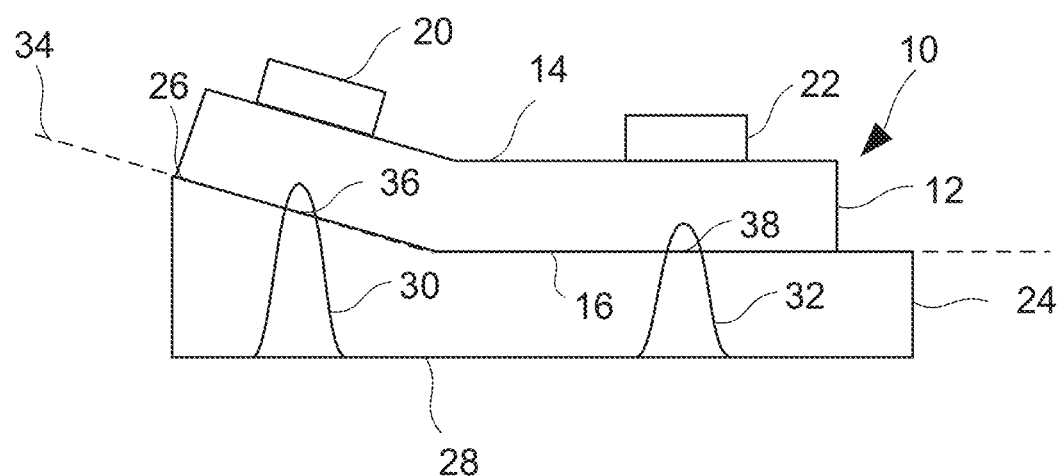

The drawings show:

FIG. 1 a sectional view of an exemplary embodiment of an optoelectronic assembly;

FIG. 2 a top view of the optoelectronic assembly from FIG. 1;

FIG. 3 a sectional view of an exemplary embodiment of an optoelectronic assembly;

FIG. 4 a top view of the optoelectronic assembly from FIG. 3;

FIG. 5 a sectional view of an exemplary embodiment of an optoelectronic assembly;

FIG. 6 a top view of the optoelectronic assembly from FIG. 5;

FIG. 7 a sectional view of an exemplary embodiment of an optoelectronic assembly;

FIG. 8 a top view of the optoelectronic assembly from FIG. 7;

FIG. 9 a sectional view of an exemplary embodiment of an optoelectronic assembly;

FIG. 10 a top view of the optoelectronic assembly from FIG. 9;

FIG. 11 a sectional view of an exemplary embodiment of an optoelectronic assembly;

FIG. 12 a top view of the optoelectronic assembly from FIG. 11;

FIG. 13 a sectional view of an exemplary embodiment of an optoelectronic assembly on production of a weld seam;

FIG. 14 a sectional view of an exemplary embodiment of an optoelectronic assembly after production of a weld seam;

FIG. 15 a flow diagram of an exemplary embodiment of a method for producing an optoelectronic assembly;

FIG. 16 a sectional view of an exemplary embodiment of an optoelectronic assembly on production of a substance-bonded connection;

FIG. 17 a flow diagram of an exemplary embodiment of a method for producing an optoelectronic assembly;

FIG. 18 a diagram with first measurement results;

FIG. 19 a diagram with second measurement results;

FIG. 20 a sectional view of an exemplary embodiment of an optoelectronic assembly.

In the following detailed description, reference is made to the attached drawings which form part of this description and in which, for illustration, specific exemplary embodiments are shown in which the invention may be performed. Since components of exemplary embodiments may be positioned in a number of different orientations, the directional terminology serves for illustration and is in no way restrictive. It is understood that other exemplary embodiments may be used, and structural or logic changes made without deviating from the scope of protection of the present invention. It is understood that the features of the various exemplary embodiments described herein may be combined unless specifically stipulated in other aspects. The following detailed description should not therefore be regarded in the restrictive sense, and the scope of protection of the present invention is defined by the attached claims. In the figures, identical or similar elements carry identical reference signs where suitable.

An optoelectronic assembly may comprise one, two or more optoelectronic components. Optionally, an optoelectronic assembly may also comprise one, two or more electronic components. An electronic component may for example be an active and/or a passive component. An active electronic component may for example comprise a calculation, control and/or regulating unit and/or a transistor. A passive electronic component may for example comprise a condenser, a resistor, a diode or a coil.

An optoelectronic component may be a component emitting electromagnetic radiation or a component absorbing electromagnetic radiation. A component absorbing electromagnetic radiation may for example be a solar cell. A component emitting electromagnetic radiation may, in various exemplary embodiments, be a semiconductor component emitting electromagnetic radiation and/or be formed as a diode emitting electromagnetic radiation, an organic diode emitting electromagnetic radiation, a transistor emitting electromagnetic radiation or an organic transistor emitting electromagnetic radiation. The radiation may for example be light in the visible range, UV light and/or infrared light. In this context, the component emitting electromagnetic radiation may for example be a light-emitting diode (LED), an organic light-emitting diode (OLED), a light-emitting transistor or an organic light-emitting transistor. The light-emitting component may, in various exemplary embodiments, be part of an integrated circuit. Furthermore, a plurality of light-emitting components may be provided, for example accommodated in a common housing.

In a substance-bonded connection, a first body is connected to a second body by means of atomic and/or molecular forces. Substance-bonded weld connections are so-called non-separable weld connections which cannot be separated without a degree of damage to one of the two bodies involved. In various embodiments, a substance-bonded connection may for example be a solder connection, for example a glass solder or a metal solder, or a weld connection.

FIG. 1 shows a sectional view of an exemplary embodiment of an optoelectronic assembly 10. The optoelectronic assembly 10 comprises a printed circuit board 12. The circuit board 12 has a first side 14 and the second side 16 facing away from the first side 14. The optoelectronic assembly 10 has at least one first optoelectronic component 20 and one second optoelectronic component 22. The components 20, 22 are arranged on the first side 14 of the circuit board 12. The components 20, 22 may be connected to the circuit board 12 for example by means of solder connections, adhesive connections or weld connections. The components 20, 22 are in particular LEDs cast into a plastic housing, LEDs without plastic housing, chip-on-board (CoB) or chip-scale package (CSP) LEDs, LED multichip arrays and/or LEDs with extreme radiation spectrum (e.g. laser diodes). The optoelectronic assembly 10 may for example be used as a lamp in the automotive sector or in the sector of general lighting.

A heat sink 24 of the optoelectronic assembly 10 has a first surface 26 and a second surface 28 facing away from the first surface 26. The printed circuit board 12 is arranged with its second side 16 on the first surface 26 of the heat sink 24. The circuit board 12 is connected to the heat sink 24 directly by substance bonding by means of at least one first weld connection 30 and a second weld connection 32. A bounding surface 34 extends between the second side 16 of the circuit board 12 and the first surface 26 of the heat sink 24. The bounding surface 34 forms a first intersecting surface 36 with the first weld connection 30, and a second intersecting surface 38 with the second weld connection 32. The weld connections 30, 32, which may also be described as keyholes, penetrate the entire heat sink 24 and additionally approximately 5% to 50%, for example around 20% of the thickness of the circuit board 12.

The circuit board 12 being connected directly to the heat sink 24 means that no adhesion-promoting agent is arranged between the circuit board 12 and the heat sink 24, and the circuit board 12 and heat sink 24 are connected together in direct bodily contact.

The circuit board 12 has a metallic carrier on which an isolation layer is formed, on which a copper layer is arranged which forms the conductor tracks. The circuit board 12 is a metal core printed circuit board (MCPCB) which has an aluminium, copper or steel core on which a dielectric is formed, which for example comprises epoxy resin, anodised i.e. oxidised aluminium oxide, or diamond-like carbon (DLC), wherein conductor tracks, in particular copper conductor tracks, are formed on the dielectric and are at least partially sealed by means of solder stop lacquer. The isolation layer, i.e. the dielectric, has a thermal conductivity of for example 0.2 W/mK to 14 W/mK. By the use of fillers in the dielectric, its thermal conductivity becomes 3 to 45 times higher than that of an FR4 circuit board. This gives a very good horizontal and vertical thermal heat conduction. The copper layer has a single e.g. mono-layer circuit. The circuit board 12 may for example be 0.1 mm to 5 mm, for example 0.5 mm to 3 mm, for example approximately 2 mm thick. The carrier comprises aluminium or copper and is 0.5 mm to 3 mm thick. The isolation layer is 70 μm to 100 μm thick. The copper layer is 18 μm to 400 μm, e.g. 35 μm to 400 μm, thick. The printed circuit board 12 may alternatively for example be a FR1, FR2, FR3, FR4, FR5, CEM1, CEM2, CEM3, CEM4 or CEM5 circuit board, for example a through contacted FR4 printed circuit board. Furthermore, a moulded and/or overmolded lead frame concept may be used as a printed circuit board 12, or a pure lead frame concept and/or pressed screen concept may be used as a printed circuit board 12.

The heat sink 24 may for example comprise or be made from a metallic material, for example aluminium, copper, steel, molybdenum, tungsten or another highly heat-conductive material, such as e.g. a suitable ceramic or a filled polymer. The heat sink 24 may for example be 0.1 mm to 0.5 mm, for example 0.2 mm to 2 mm, e g approximately 1 mm thick.

For example, the circuit board 12 may comprise aluminium on the second side 16, and heat sink 24 may comprise aluminium or copper on the first surface 26. Alternatively or additionally, soft coatings may be formed on the second side 16 and/or the first surface 26, for example the circuit board 12 and/or the heat sink 24 may comprise special steel in the core which is coated with tin. Furthermore, the heat sink 24 may be formed metallic and be welded to a metallic coated AlN ceramic (submount), which for example is used in the vehicle headlamp sector. Thus it is possible to weld metallic heat sinks 24, for example of Al, Cu, WCu etc. to metal-coated ceramic submount LEDs, e.g. AlN with layers of Al, Sn, Cu, Pt, Pd, Au, Ag, Pd, Ni, Fe, etc. Thus the heat sink 24 may also be laser welded to a metal-coated ceramic.

Furthermore, as an alternative to aluminium, a material may be used for the heat sink 24 which has a thermal expansion coefficient in the region of that of AlN ceramic, for example molybdenum, tungsten, tungsten copper etc. As an alternative to the above-mentioned material pairings Al/Al and Al/Cu for the second side 16 and the first surface 26, for example also Cu/Cu, Sn/Cu, Sn/Al, W/Mo, W/Cu, Mo/Cu, W/Cu, Al/Fe, Sn/Fe, Ni/Sn, Ni/Fe, Ni/Cu, Pt/Sn, Fe/Cu, Al/C, W/C or pairings with Ni/Pd/Au etc. may be welded.

If a coating is provided, in particular a soft coating, on the second side 16 and/or the first surface 26, this may for example be a coating produced by means of micro- or nano-powder and/or an extremely thin metallic coating to compensate for roughness peaks, for example a boron nitride or carbon coating with a thermal conductivity of around 400 W/mK, or a silver nano-powder with a thermal conductivity of more than 400 W/mk, wherein the layer thicknesses lie in the order of magnitude of the surface roughness or are preferably slightly larger, and the coatings are formed at least directly behind or below the components 20, 22. In this way, costs can be saved in surface-machining of cooling bodies. Also, the thermal conductivity can be improved further in that particularly highly thermally conductive coatings and/or thermal conductivity pastes or powders are arranged between the materials pretensioned by means of the weld connections. In particular, in applications with extreme requirements in relation to thermal conductivity, e.g. a copper printed circuit board, behind the components coatings may be used with carbon nano-tubes, or diamond or DLC nano-powder or nano-pastes with a typical thermal conductivity of 360 to 1000 W/mK.

The bounding surface 34 is not a real surface of the optoelectronic assembly 10 but merely an imaginary face which serves for definition of the first intersecting surface 36 and where applicable further intersecting surfaces, and hence for definition of the formation and position of the first weld connection 30 and any further weld connections. The bounding surface 34, before formation of the first weld connection 30, may for example correspond to the second side 16 of the circuit board 12 or to the first surface 26 of the heat sink 24, or at least run parallel thereto. On formation of the first weld connection 30 however, the materials of the second side 16 of the circuit board 12 and the first surface 26 of the heat sink 24 melt, so that after formation of the first weld connection 30, these are no longer clearly defined in the region of the first weld connection 30; for this reason, after formation of the first weld connection 30, the bounding surface 34 is a support construct to enable the position of the first intersecting surface 36 to be defined precisely relative to the first component 20. The second side 16 of the circuit board 12 and the first surface 26 of the heat sink 24 are configured flat, therefore the bounding surface 34 lies in a plane and may be described as a bounding plane. If, in an alternative embodiment, the second side 16 of the circuit board 12 and the first surface 26 of the heat sink 24 are formed curved, the bounding surface 34 is curved correspondingly.

FIG. 2 shows a top view of an optoelectronic assembly 10 according to FIG. 1. In addition to the first and second components 20, 22, two further optoelectronic components 20, 22 are arranged. Alternatively however, only one, two or more than four optoelectronic components 20, 22 may be arranged. The optoelectronic components 20, 22 each overlap a respective weld connection 30, 32 at least partially, in particular completely. The optoelectronic components 20, 22 and the corresponding weld connections 30, 32 are arranged in the corners of a rectangle. Alternatively, the components 20, 22 could also be arranged at the corners of a triangle or another polygonal shape, or along a line or a circle shape, for example along a circle or an ellipse. One of the weld connections 30, 32 is assigned to each component 20, 22, and in top view is arranged directly below or behind the corresponding component 20, 22. In addition, one, two or three more weld connections 30, 32 may be formed at one or more of the components 20, 22.

The first and the second weld connections 30, 32 may be formed simultaneously or successively. For example, the second weld connection 32 may be formed after a predefined time period after the first weld connection 30. The optoelectronic assembly 10 may be cooled during the predefined time period.

In the exemplary embodiment shown in FIG. 2, the first and second intersecting surfaces 36, 38 are arranged substantially centrally below the optoelectronic components 20, 22. The first and second intersecting surfaces 36, 38 are thus arranged below a light outlet face or a light inlet face of the optoelectronic component. In particular, the first and second intersecting surfaces 30, 36 may in top view be arranged below the active layer of the optoelectronic components.

FIG. 3 shows a sectional view of an exemplary embodiment of an optoelectronic assembly 10, and FIG. 4 shows a top view of the optoelectronic assembly 10 according to FIG. 3.

The optoelectronic assembly 10 may for example largely correspond to the optoelectronic assembly 10 described above, or be part thereof. In particular, the first component 20 may correspond to the first component 20 described above. The first weld connection 30 is formed circular in top view. This causes that the first intersecting surface 36 is formed annular. The first component 20 overlaps the first intersecting surface 36 at least partially, in particular completely. In top view, the first weld connection 30 completely surrounds a circular area. In other aspects, the first weld connection 30 may be formed correspondingly to the first weld connection 30 explained above.

The first weld connection 30 may for example be formed by a weld bead. For example, a laser beam used to form the first weld connection 30 may be guided in a meander pattern along the ring shape, shown in FIG. 4, of the first intersecting surface 36. The inner and outer diameters of the first intersecting surface 36 may for example depend on a size of the first component 20. For example, the inner diameter may be between 1 mm and 10 mm, for example between 2 mm and 8 mm, for example between 3 mm and 6 mm in size.

If a coating is formed on the second side 16 or the first surface 26, this may for example be formed exclusively inside the ring shape of the first intersecting surface 36 and be surrounded by the first intersecting surface 36 in the radial direction. The first intersecting surface 36 may then form a hermetic seal of the coating, which may be particularly advantageous if the coating has a material which gasifies out over time or dissolves at high temperatures, since the resulting gases or the dissolved constituents may then be enclosed between the circuit board 12, the heat sink 24 and the first intersecting surface 36. The adhesion of such a coating may be of little or negligible significance, since the mechanical connection may be formed substantially or exclusively by the first weld connection 30. The coating may however contribute to improve the heat dissipation.

FIG. 5 shows a sectional view of an exemplary embodiment of an optoelectronic assembly 10, and FIG. 6 shows a top view of the optoelectronic assembly according to FIG. 5.

The optoelectronic assembly 10 may for example largely correspond to one of the optoelectronic assemblies 10 described above, or be part of one of these. In particular, the first component 20 may correspond to the first component 20 explained above. The first weld connection 30 is formed circular in top view. This causes that the first intersecting surface 36 is formed annular. The first component 20 overlaps the first intersecting surface 36 at least partially, in particular completely. In top view, the first weld connection 30 surrounds a circular area completely. In other aspects, the first weld connection 30 may be formed correspondingly to the first weld connection 30 explained above. The second weld connection 32 is formed circular in top view and arranged inside and concentric to the first weld connection 30. The second intersecting surface 38 is formed annular in top view. The second weld connection 32 surrounds a circular area completely. In other aspects, the second weld connection 30 may be formed correspondingly to the second weld connection 38 explained above.

FIG. 7 shows a sectional view of an exemplary embodiment of an optoelectronic assembly 10, and FIG. 8 shows a top view of the optoelectronic assembly 10 according to FIG. 7.

The optoelectronic assembly 10 may for example largely correspond to the optoelectronic assembly 10 explained above. In particular, the components 20, 22 may correspond to the components 20, 22 described above. The first weld connection is formed circular in top view. This causes that the first intersecting surface 36 is formed annular. The components 20, 22 overlap the first intersecting surface 36 at least partially. In particular, the components 20, 22 overlap segments of the first intersecting surface 36. In top view, the first weld connection 30 completely surrounds a circular area. In other aspects, the first weld connection 30 may be formed correspondingly to the first weld connection 30 explained above.

FIG. 9 shows a sectional view of an exemplary embodiment of an optoelectronic assembly 10, and FIG. 10 shows a top view of the optoelectronic assembly according to FIG. 9.

The optoelectronic assembly 10 may for example largely correspond to one of the optoelectronic assemblies 10 explained above. In particular, the components 20, 22 may correspond to the components 20, 22 explained above. The first weld connection is formed circular in top view. This means that the first intersecting surface 36 is formed annular. The components 20, 22 overlap the first intersecting surface 36 at least partially. In particular, the components 20, 22 overlap segments of the first intersecting surface 36. In top view, the first weld connection 30 completely surrounds a circular area. In other aspects, the first weld connection 30 may be formed correspondingly to the first weld connection 30 explained above. The second weld connection 32 is formed circular in top view, and is arranged inside and concentric to the first weld connection 30. The components 20, 22 each overlap the second intersecting surface 38 at least partially. In particular, the components 20, 22 overlap segments of the second intersecting surface 38. The second intersecting surface 38 is formed annular in top view. The second weld connection 38 completely encloses a circular area. In other aspects, the second weld connection 38 may be formed correspondingly to the second weld connection 38 explained above.

FIG. 11 shows a sectional view of an exemplary embodiment of an optoelectronic assembly 10, and FIG. 12 shows a top view of the optoelectronic assembly 10 according to FIG. 11.

The optoelectronic assembly 10 may for example largely correspond to one of the optoelectronic assemblies 10 explained above. In particular, the components 20, 22 may correspond to the components 20, 22 explained above. The components 20, 22 are arranged in rows and columns, in particular in matrix form. The weld connections 30, 32 are formed linear and parallel to each other in top view. The weld connections 30, 32 are arranged along the columns formed by the components 20, 22. Alternatively, the weld connections 30, 32 may be arranged along the rows formed by the components 20, 22. The components 20, 22 each overlap the intersecting surfaces 36, 38 at least partially. In other aspects, the weld connections 30, 32 may be formed correspondingly to the weld connections 30, 32 explained above.

FIG. 13 shows a sectional view of an exemplary embodiment of an optoelectronic assembly 10 on production of a weld connection. The optoelectronic assembly 10 may for example largely correspond to one of the optoelectronic assemblies 10 explained above, or at least form part thereof. The weld connection may for example largely correspond to one of the weld connections 30, 32 explained above, for example the first weld connection 30.

The first weld connection 30 is produced by means of a laser 61 which generates a laser beam 60. The laser beam 60 is radiated from the outside onto the second surface 28 of the heat sink 24. In FIG. 13, the laser beam 60 thus hits the optoelectronic assembly 10 from below. The laser beam 60 is radiated onto the optoelectronic assembly 10 such that the first weld connection 30 is formed at least partially below the first component 20, in particular such that the first component 20 at least partially overlaps the first intersecting surface 36.

If smoke 68, i.e. smoke containing particles, is produced during formation of the first weld connection 30, the smoke 68 may be extracted by means of an extraction device 69.

On formation of the first weld connection 30, the materials of the circuit board 12 and/or the heat sink 24 are heated such that these melt locally, wherein the materials of the heat sink 24 and the circuit board 12 mix together. The energy and wavelength of the laser beam 60, and the duration for which the laser beam 60 is radiated onto the optoelectronic assembly 10, must be selected such that firstly the first weld connection 30 is produced, in particular the materials of the heat sink 24 and circuit board 12 melt, but secondly such that the heat generated is not so great that the first component 20 is damaged. After radiation by means of the laser beam 60, the melted material cools and hardens, and forms the substance-bonded direct first weld connection 30 between the heat sink 24 and the circuit board 12.

Optionally, the heat sink 24 and/or the circuit board 12 may be cooled during formation of the first weld connection 30. This may help prevent the first component from overheating. This allows a greater freedom in selection of the suitable energy or wavelength for the laser beam 60. The cooling may take place for example by means of air or gas cooling, in particular by blowing of the optoelectronic assembly with gas or air, or by means of direct bodily contact of the heat sink 24 or circuit board 12 with a cooling body (not shown).

Optionally, the energy and/or the wavelength of the laser beam 60 and/or the duration of the radiation may be selected such that the circuit board 12 is heated so greatly that a substance-bonded connection is created between the circuit board 12 and the first component 20. This substance-bonded connection may for example be a solder connection or a weld connection. For example, solder may be arranged between the circuit board 12 and the first component 20, which heats on formation of the first weld connection 30 such that it melts and, after cooling, connects the first component and circuit board 12 together by substance bonding.

The laser 61 may for example be a Nd:YAG laser. The weld connections 30, 32 may for example be produced in continuous wave mode. The geometries, in particular the weld bead geometry, may be produced by means of scanner optics. The weld connections 30, 32 may be produced at a speed for example of around 100 mm/s. The time for production of the weld connections 30, 32 may in total be approximately 1 s per optoelectronic assembly 10, for example for four to six weld connections 30, 32 which are circular in top view. A focus diameter of the laser beam 60 may for example lie in a range from 10 μm to 200 μm, in order to introduce little total thermal energy into the optoelectronic assembly 10 with a narrow focus. This may contribute to neither the circuit board 12 nor the first component 20 being damaged by the melted material directly behind the first components 20. An energy of the laser 61 may for example be approximately 950 W. Furthermore, the laser 61 may be a TruFiber 1000 laser with LLk 0.020 mm, PFO 20 fc=90 mm and f=135 mm.

FIG. 14 shows a sectional view of an exemplary embodiment of an optoelectronic assembly 10 which for example may largely correspond to one of the optoelectronic assemblies 10 described above or form part thereof, after production of a weld connection which for example may correspond to one of the weld connections 30, 32 explained above. In this exemplary embodiment, because of component inaccuracies and/or surface roughnesses, the second side 16 of the circuit board 12 and the first surface 26 of the heat sink 24 may not lie flat against each other, but in some regions may have a slight distance from each other, for example a distance of less than 2 mm. As explained above however, on cooling of the material melted by means of the laser beam 60, shrinkage stresses occur and the circuit board 12 is drawn towards the heat sink 24 in the region of the weld connections 30, 32, in particular the first weld connection 30. Thus, laterally next to the weld connections 30, 32, small gaps may occur which may however be disregarded because of the particularly high thermal coupling because of the weld connections 30, 32.

FIG. 15 shows a flow diagram of an exemplary embodiment of a method for producing an optoelectronic assembly, for example one of the optoelectronic assemblies 10 explained above.

In a step S2, a printed circuit board is provided, for example the printed circuit board 12 explained above.

In a step S4, an optoelectronic component is arranged. For example, one of the components 20, 22 explained above is arranged on the circuit board 12. The components 20, 22 may be attached immediately to the circuit board 12 and/or connected thereto electrically, for example by means of an adhesive, an electrically conductive adhesive, a heat-conductive adhesive, and/or by means of soldering. Alternatively, the mechanical and/or electrical connection of the components 20, 22 to the circuit board 12 may be created at a later time, for example at the same time as formation of the weld connection 30, 32.

In a step S6, a heat sink is arranged. For example, the heat sink 24 is arranged on the circuit board 12. Alternatively, the circuit board 12 may be arranged on the heat sink 24.

In a step S8, the heat sink is connected to the circuit board. In particular, the heat sink 24 is connected to the circuit board 12 directly by substance bonding by means of a laser beam, for example the laser beam 60, in particular by formation of the first and/or second weld connections 30, 32. In particular, the laser beam 60 is radiated from the outside onto the second surface 26 of the heat sink 24 such that the material of the heat sink 24, at least within the focus of the laser beam 60, is melted over the entire thickness of the heat sink 24, and the material of the circuit board 12 is melted to a depth which corresponds for example to 5% to 50%, preferably approximately 20% of the thickness of the printed circuit board 12. The laser beam 60 may be generated for example by means of the laser 61 explained above. Then the weld connections 30, 32 cool and the mixed material hardens, whereby the substance-bonded direct connection of the circuit board 12 to the heat sink 24 is created.

In an optional step S10, simultaneously with step S8, a component is connected to the circuit board. For example, the first component 20 is connected to the circuit board 12 while the first weld connection 30 is formed. In particular, the first component 20 is connected to the circuit board 12 because of the heat which occurs on formation of the first weld connection 30.

In an optional step S12, simultaneously with step S8, the optoelectronic assembly 10 is cooled, for example as already described above.

In an optional step S14, simultaneously with step S8, smoke 68 which occurs on formation of the first weld connection 30 is extracted, for example as already explained above.

FIG. 16 shows a sectional view of an exemplary embodiment of an optoelectronic assembly 10 on production of a substance-bonded connection. The optoelectronic assembly 10 comprises the circuit board 12 and the first component 20. Optionally, the optoelectronic assembly 10 may also comprise further components 20, 22. Solder 70 is arranged between the first component 20 and the circuit board 12. By means of a laser beam 60 generated by a laser 61, the circuit board 12 is heated such that the solder 70 melts. The laser beam 60 is radiated from the outside onto the second side 16 of the circuit board 12. After irradiation of the circuit board 12 by the laser beam 60, the circuit board 12 and the melted solder 70 cool, and the solder 70 connects the circuit board 12 indirectly to the first component 20. The hardened solder forms a substance-bonded indirect connection, in particular a mechanical and/or electrical connection, between the circuit board 12 and the first component 20.

FIG. 17 shows a flow diagram of an exemplary embodiment of a method for producing an optoelectronic assembly 10 which may for example correspond to the optoelectronic assembly 10 explained with reference to FIG. 16.

In a step S16, a circuit board is provided, for example the circuit board 12 explained above.

In a step S18, an optoelectronic component is arranged. For example, the first component 20 explained above is arranged on the circuit board 12.

In a step S20, the circuit board 12 is connected to the first component 20. In particular, the circuit board 12 is connected indirectly by substance bonding to the first component 20 by means of a laser beam, for example the laser beam 60. In particular, the laser beam 60 is radiated from the outside onto the second surface 26 of the heat sink 24 such that the solder 70 melts.

FIG. 18 shows a first diagram with first measurement results. In the first diagram, the X axis shows the power of the laser 61, and the Y axis the temperature of a solder point at which one of the components 20, 22 is connected to the circuit board 12, during operation of the optoelectronic assembly 10. The temperature of the solder point is representative of a quality of the heat dissipation from the corresponding component 20, 22 via the circuit board 12 to the heat sink 24. In particular, the heat dissipation from the corresponding component 20, 22 via the circuit board 12 to the heat sink 24 is better, the lower the temperature of the solder point during operation of the optoelectronic assembly 10.

The circular measurement points correspond to measurements at which the circuit board 12 is connected to the heat sink 24 exclusively by means of a conventional low-cost heat-conductive adhesive. The circular measurement points all lie above 100° C.

The triangular measurement points correspond to measurements at which the circuit board 12 is connected to the heat sink 24 exclusively by means of a conventional high-quality heat-conductive adhesive. The triangular measurement points all lie between 97° C. and 100° C. Thus the triangular measurement points all lie below circular measurement points. This means that the high-quality heat-conductive adhesive gives a better heat dissipation than the low-cost heat-conductive adhesive.

The square measurement points correspond to measurements at which the circuit board 12 is connected to the heat sink 24 exclusively by means of weld connections 30, 32 which are formed directly behind or below the components 20, 22. The square measurement points all lie between 97° C. and 100° C. Thus the square measurement points lie in the region of the triangular measurement points. This means that by means of the weld connections 30, 32 directly behind or below the components 20, 22, the heat dissipation is comparable to that with use of a high-quality heat-conductive adhesive.

For detection of the first measurement results, the optoelectronic assembly 10 used is always the same; only the power detected varies from measurement to measurement.

FIG. 19 shows a second diagram the second measurement results. The X axis shows vertical bars which are representative of different geometries of the weld connections 30, 32. The Y axis shows the temperatures of a solder point between one of the components 20, 22 and the circuit board 12 during operation of the optoelectronic assembly 10.

A first bar 80 shows that the temperature of the solder point during operation of the optoelectronic assembly 10 lies at 98° C. The first bar 80 and the corresponding temperature were recorded using an optoelectronic assembly 10 which has four components 20, 22 arranged, in top view, in the corners of a square, as shown for example in FIG. 8, and in which the circuit board 12 is connected to the heat sink 24 by means of eighteen weld connections 30, 32 which are circular in top view. The weld connections 30, 32 are formed concentrically in pairs, as shown for example in FIG. 6, wherein a pair of these concentric weld connections 30, 32 is formed behind each of the four components 20, 22, and wherein the other weld connections 30, 32 are also formed concentrically in pairs and arranged, in top view, between the components 20, 22. Visually speaking, the pairs of concentrically formed weld connections 30, 32 are, in top view, formed on the individual cells of a matrix form with three rows and three columns, wherein the components 20, 22 are arranged at the outer corners of the matrix form.

A second bar 82 shows that the temperature of the solder point during operation of the optoelectronic assembly 10 lies at 99° C. The second bar 32 and the corresponding temperature were detected with the same optoelectronic assembly 10 as the first bar 80.

A third bar 84 shows that the temperature of the solder point during operation of the optoelectronic assembly 10 lies at 99° C. The third bar 84 and the corresponding temperature were recorded using an optoelectronic assembly 10 which has four components 20, 22 arranged, in top view, in the corners of a square, as shown for example in FIG. 8, and in which the circuit board 12 is connected to the heat sink 24 by means of four weld connections 30, 32 which are circular in top view. One of the weld connections 30, 32 is formed behind each of the four components 20, 22.

A fourth bar 86 shows that the temperature of the solder point during operation of the optoelectronic assembly 10 lies at 100° C. The fourth bar 86 and the corresponding temperature were detected with the same optoelectronic assembly 10 as the third bar 84, but before formation of the weld connection 30, 32, a gap of 0.22 mm was artificially formed between the circuit board 12 and the heat sink 24. This gap was bridged on production of the weld connections 32 [sic], 32, as shown in FIG. 14.

A fifth bar 88 shows that the temperature of the solder point during operation of the optoelectronic assembly 10 lies at 101° C. The fifth bar 88 and the corresponding temperature were detected with the same optoelectronic assembly 10 as the fourth bar 86.

A sixth bar 90 shows that the temperature of the solder point during operation of the optoelectronic assembly 10 lies at 102° C. The sixth bar 90 and the corresponding temperature were recorded using an optoelectronic assembly 10 which has four components 20, 22, which are arranged, in top view, in the corners of a square, as shown for example in FIG. 8, and in which the circuit board 12 is connected to the heat sink 24 by means of two weld connections 30, 32 which are circular in top view.

The weld connections 30, 32 are formed concentrically, as shown for example in FIG. 10, wherein at least one segment of these concentric weld connections 30, 32 is formed behind each of the four components 20, 22.

A seventh bar 92 shows that the temperature of the solder point during operation of the optoelectronic assembly 10 lies at 103° C. The seventh bar 92 and the corresponding temperature were recorded using an optoelectronic assembly 10 which has four components 20, 22 which are arranged, in top view, in the corners of the square, as shown for example in FIG. 8, and in which the circuit board 12 is connected to the heat sink 24 by means of one weld connection 30 which is circular in top view, as shown for example in FIG. 8.

An eighth bar 94 shows that the temperature of the solder point during operation of the optoelectronic assembly 10 lies at 100° C. The eighth bar 94 and the corresponding temperature were recorded using an optoelectronic assembly 10 which has four components 20, 22 which are arranged, in top view, in the corners of a square, as shown for example in FIG. 8, and in which the circuit board 12 is connected to the heat sink 24 by means of a high-quality heat-conductive adhesive.

The second diagram and the second measurement results show that the heat dissipation in the optoelectronic assemblies 10 in which the circuit board 12 is connected to the heat sink 24 exclusively by means of the weld connections 30, 32, formed at least partially behind the components 20, 22, lies in principle in the region of the heat dissipation in the optoelectronic assemblies 10 in which the circuit board 12 is connected to the heat sink 24 exclusively by means of the high-quality heat-conductive adhesive. Here, the quality of the heat dissipation increases with the number of weld connections 30, 32. Also, it has a positive effect on the heat dissipation if one or two weld connections 30, 32 are formed individually for each component 20, 22, and the intersecting surfaces 36, 38 of which are overlapped exclusively by the corresponding components 20, 22. Furthermore, in particular the fourth and the fifth bars 86, 88 show that even with a gap between the circuit board 12 and the heat sink 24, the heat dissipation is sufficiently high because of the weld connections 30, 32.

The optoelectronic assembly 10 may for example be a OSRAM Classic Superstar A60 lamp.

FIG. 20 shows an exemplary embodiment of an optoelectronic assembly 10 which for example may correspond largely to one of the optoelectronic assemblies 10 explained above. In the optoelectronic assembly 10, the second side 16 of the circuit board 12 and the first surface 26 of the heat sink 24 have a kink. The bounding surface 34 has a corresponding kink. In other words, the heat sink 24 has a bias and the circuit board 12 and the bounding surface 34 are adapted to the bias.

The invention is not restricted to the exemplary embodiments described. For example, the exemplary embodiments shown may be combined with each other. For example, the optoelectronic assemblies 10 shown may have more or fewer of the components 20, 22 shown. Furthermore, the optoelectronic assemblies 10 shown may have more or fewer of the weld connections 30, 32 shown. For example, in addition to the weld connections 30, 32 formed directly behind or below the components 20, 22, further weld connections may be provided which are not formed directly behind or below the components 20, 22. Furthermore, the weld connections 30, 32 may in top view have different shapes, for example polygonal forms, in particular triangular, rectangular, in particular square, or circular or round forms, in particular elliptical forms. Furthermore, all of the weld connections 30, 32 shown may have the forms shown in the rough top views depicted, but in detail may be formed by meandering lines—weld beads—which then form the shapes shown in the rough top views.

The invention claimed is:

1. An optoelectronic assembly comprising:
a printed circuit board;
at least one first optoelectronic component arranged on a first side of the printed circuit board; and
a heat sink comprising a first surface arranged on a second side of the printed circuit board, wherein the second side faces away from the at least one first optoelectronic component;
wherein the heat sink is connected directly to the printed circuit board by at least one first weld connection that forms a first intersecting surface which extends through the second side of the printed circuit board and the first surface of the heat sink; and
wherein the at least one first optoelectronic component at least partially overlaps the first intersecting surface such that an active layer of the at least one first optoelectronic component and the first intersecting surface at least partially overlap.

2. The optoelectronic assembly according to claim 1, wherein the at least one first optoelectronic component completely overlaps the first intersecting surface.

3. The optoelectronic assembly according to claim 1, wherein the at least one first weld connection extends through an entire thickness of the heat sink.

4. The optoelectronic assembly according to claim 1, wherein the at least one first weld connection, in a direction parallel to an interface of the second side of the printed circuit board and the first surface of the heat sink, is formed at least one of linear, polygonal, circular, and as a meander.

5. An optoelectronic assembly comprising:
a printed circuit board;
at least one first optoelectronic component arranged on a first side of the printed circuit board; and
a heat sink comprising a first surface arranged on a second side of the printed circuit board facing away from the at least one first optoelectronic component;
wherein the heat sink is connected directly to the printed circuit board by at least one first weld connection that forms a first intersecting surface which extends through the second side of the printed circuit board and the first surface of the heat sink;
wherein the at least one first optoelectronic component at least partially overlaps the first intersecting surface such that an active layer of the at least one first optoelectronic component and the first intersecting surface at least partially overlap;
wherein the at least one first weld connection, in a direction parallel to an interface of the second side of the printed circuit board and the first surface of the heat sink, is formed circular; and wherein the heat sink is further connected directly to the printed circuit board by at least one second weld connection that forms a second intersecting surface which extends through the second side of the printed circuit board and the first surface of the heat sink and which is formed concentrically to the at least one first weld connection.

6. The optoelectronic assembly according to claim 5, wherein at least one of the at least one first weld connection and the at least one second weld connection penetrates the printed circuit board to a depth which corresponds to 5% to 50% of a thickness of the printed circuit board.

7. A method for producing an optoelectronic assembly, the method comprising:
providing a printed circuit board;
providing at least one first optoelectronic component arranged on a first side of the printed circuit board;
arranging a first surface of a heat sink on a second side of the printed circuit board facing away from the first side; and
connecting the printed circuit board directly to the heat sink by at least one first weld connection, wherein the at least one first weld connection is formed via a laser beam radiated from outside the optoelectronic assembly onto a second surface of the heat sink facing away from the printed circuit board such that the at least one first weld connection forms a first intersecting surface which extends through the second side of the printed circuit board and the first surface of the heat sink, and wherein the at least one first optoelectronic component at least partially overlaps the first intersecting surface such that an active layer of the at least one first optoelectronic component and the first intersecting surface at least partially overlap.

8. The method according to claim 7, further comprising: cooling at least one of the heat sink and the printed circuit board during formation of the at least one first weld connection.

9. The method according to claim 7, further comprising: during formation of the at least one first weld connection, extracting smoke produced on formation of the at least one first weld connection.

10. The method according to claim 7, further comprising: connecting the printed circuit board directly to the heat sink by at least one second weld connection, wherein the at least one second weld connection is formed via a laser beam radiated from outside the optoelectronic assembly onto the second surface of the heat sink.

11. The method according to claim 10, wherein the at least one second weld connection is formed after a predefined time period after formation of the at least one first weld connection.

12. The method according to claim 7, wherein simultaneously with formation of the at least one first weld connection and via the same laser beam with which the at least one first weld connection is formed, the at least one first optoelectronic component is connected to the printed circuit board.

13. The optoelectronic assembly according to claim 1, wherein on formation of the at least one first weld connection, a material of the second side of the printed circuit board and a material of the first surface of the heat sink melt such that, in formation of the at least one first weld connection, the respective materials are mixed together in a region of the at least one first weld connection.

14. The method according to claim 7, wherein on formation of the at least one first weld connection, a material of the second side of the printed circuit board and a material of the first surface of the heat sink melt such that, in formation of the at least one first weld connection, the respective materials are mixed together in a region of the at least one first weld connection.

15. The optoelectronic assembly according to claim 1, wherein the second side of the printed circuit board and the first surface of the heat sink are curved in a region of the at least one first weld connection.

16. The method according to claim 7, wherein the second side of the printed circuit board and the first surface of the heat sink are curved in a region of the at least one first weld connection.

17. The optoelectronic assembly according to claim 1, wherein the at least one first optoelectronic component is a light-emitting diode (LED), an organic light-emitting diode (OLED), or a solar cell.

18. The method according to claim 8, wherein cooling the at least one of the heat sink and the printed circuit board involves at least one of:
blowing of the optoelectronic assembly with air or a gas; and
providing direct bodily contact of the at least one of the heat sink and the printed circuit board with a cooling body external to the optoelectronic assembly.

19. The optoelectronic assembly according to claim 5, further comprising at least one second optoelectronic component arranged on the first side of the printed circuit board and at least partially overlapping at least one of the first intersecting surface and the second intersecting surface.

20. An optoelectronic assembly comprising:
a printed circuit board;
at least one first optoelectronic component arranged on a first side of the printed circuit board; and
a heat sink comprising a first surface arranged on a second side of the printed circuit board facing away from the at least one first optoelectronic component;
wherein the heat sink is connected directly to the printed circuit board by at least one first weld connection that forms a first intersecting surface which extends through the second side of the printed circuit board and the first surface of the heat sink;
wherein the at least one first optoelectronic component at least partially overlaps the first intersecting surface such that an active layer of the at least one first optoelectronic component and the first intersecting surface at least partially overlap;
wherein the at least one first weld connection, in a direction parallel to an interface of the second side of the printed circuit board and the first surface of the heat sink, is formed rectilinear; and
wherein the heat sink is further connected directly to the printed circuit board by at least one second weld connection that forms a second intersecting surface which extends through the second side of the printed circuit board and the first surface of the heat sink and which is formed parallel to the at least one first weld connection.

* * * * *